United States Patent
Nam et al.

[11] Patent Number: 6,054,391
[45] Date of Patent: Apr. 25, 2000

[54] METHOD FOR ETCHING A PLATINUM LAYER IN A SEMICONDUCTOR DEVICE

[75] Inventors: Byeong-yun Nam, Suwon; Byong-sun Ju, Seoul, both of Rep. of Korea

[73] Assignee: Samsung Electronics Co., Ltd., Suwon, Rep. of Korea

[21] Appl. No.: 09/138,655

[22] Filed: Aug. 24, 1998

[30] Foreign Application Priority Data

Jan. 16, 1998 [KR] Rep. of Korea ......................... 98-1200

[51] Int. Cl.[7] ...................... H01L 21/00; H01L 21/3065
[52] U.S. Cl. ........................................... 438/706; 438/720
[58] Field of Search .................................. 438/706, 650, 438/720

[56] References Cited

U.S. PATENT DOCUMENTS

| | | | |
|---|---|---|---|
| 5,515,984 | 5/1996 | Yokoyama et al. | 216/41 |
| 5,573,979 | 11/1996 | Tsu et al. | 438/396 |
| 5,618,754 | 4/1997 | Kasahara | 438/653 |
| 5,658,820 | 8/1997 | Chung | 438/3 |
| 5,726,102 | 3/1998 | Lo | 438/718 |
| 5,840,200 | 11/1998 | Nakagawa et al. | 216/6 |
| 5,930,639 | 7/1999 | Schuele et al. | 438/396 |

*Primary Examiner*—Benjamin L. Utech
*Assistant Examiner*—Lynette T. Umez-Eronini
*Attorney, Agent, or Firm*—Howrey Simon Arnold & White, LLP

[57] ABSTRACT

A method of etching a platinum (Pt) layer of a semiconductor device includes the steps of forming a platinum layer on a semiconductor substrate, and forming a mask layer on the platinum layer. A photoresist pattern is formed on the mask layer and a mask pattern is formed by plasma-etching using the photoresist pattern as a mask. A platinum pattern is formed by plasma-etching using the photoresist pattern and the mask pattern as a mask. A platinum etching by-product is formed on the sidewalls of the photoresist pattern. The platinum layer is plasma-etched using Ar, $Ar/Cl_2$ or Ar/HBr gas. The photoresist pattern is removed and then the platinum etching by-product and the mask pattern are removed by plasma etching. The platinum etching by-product is plasma-etched using $Cl_2/O_2$ or $HBr/O_2$ gas. The platinum pattern may be formed in the same etch chamber through multiple steps, and the platinum layer is etched using Ar, $Ar/Cl_2$ or Ar/HBr, to thereby increase the etch rate and obtain a platinum pattern having a high etch slope.

7 Claims, 2 Drawing Sheets

METHOD FOR ETCHING A PLATINUM LAYER IN A SEMICONDUCTOR DEVICE

BACKGROUND OF THE INVENTION

1. Field of the Invention

The present invention relates to a method for manufacturing a semiconductor device, and more particularly, to a method for etching a platinum (Pt) layer in a semiconductor device.

2. Description of the Related Art

As the semiconductor manufacturing technology develops and its application expands, a need has developed for a semiconductor device having a large capacitance. However, it is difficult to obtain such a large capacitance using a dielectric layer having a low dielectric constant such as an oxide and/or nitride layer. Therefore, a high dielectric constant material such as ferroelectric materials, e.g., BST (BaSr)TiO$_3$, PZT (PbZrTiO$_3$), PLZT (Pb, La)(Zr, Ti)O$_3$ is used. Further, a chemically stable electrode material having a high oxidation resistance at a high temperature, e.g., a platinum (Pt) layer, is required to endure the high temperature process for depositing a high dielectric material.

However, it is difficult to form a fine platinum pattern because platinum does not react well with etchants. Also, etching by-product of platinum has low volatility and it precipitates on the sidewall of a mask material during a dry etching process. In particular, it is very difficult to remove the etching by-product without damaging the mask material. Once the mask material is damaged, the storage-node platinum pattern starts to be etched, and thus the resultant surface area of the platinum pattern is decreased. The decrease in surface area of the platinum pattern results in a decrease in the capacitance of the capacitor.

SUMMARY OF THE INVENTION

To solve the above problems, it is an object of the present invention to provide a method of etching a platinum (Pt) layer in a semiconductor device to obtain a platinum pattern having a steep etch slope without leaving an etching by-product.

To achieve the above object, the disclosed method of etching a platinum layer in a semiconductor device includes the steps of forming a platinum layer on a semiconductor substrate, and forming a mask layer on the platinum layer. A photoresist pattern is formed on the mask layer and a mask pattern is formed by plasma-etching, using the photoresist pattern as a mask. A platinum pattern is formed by plasma-etching, using the photoresist pattern and the mask pattern as a mask. The platinum layer may be plasma-etched using Ar, Ar/Cl$_2$ or Ar/HBr gas, for example. Preferably, the Ar/Cl$_2$ or Ar/HBr gas used to plasma-etch the platinum layer consists of 80~95% Ar gas. When etching the platinum layer, a platinum etching by-product is formed on the sidewalls of the photoresist pattern. The photoresist pattern and the mask pattern are removed and then the platinum etching by-product and the mask pattern are removed by plasma etching using Cl$_2$/O$_2$ or HBr/O$_2$ gas, for example. Preferably, the Cl2/O$_2$ or HBr/O$_2$ used to plasma-etch the platinum etching by-product consists of 40~95% O$_2$ gas.

According to the present invention, the multiple steps involved in forming the platinum pattern may be carried out in the same etch chamber, and the platinum layer is etched using Ar, Ar/Cl$_2$ or Ar/HBr, to thereby increase the etch rate and obtain a platinum pattern having a steep etch slope.

BRIEF DESCRIPTION OF THE DRAWINGS

The above object and advantages of the present invention will become more apparent through a description of a preferred embodiment thereof with reference to the attached drawings in which.

DESCRIPTION OF THE PREFERRED EMBODIMENT

Figure 1:
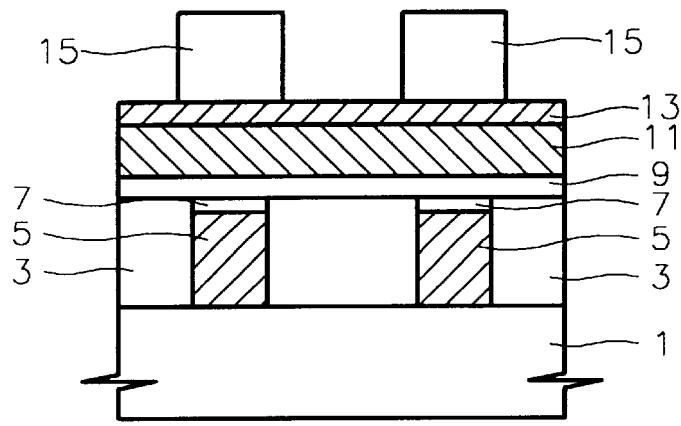
FIGS. 1 through 6 are sectional views illustrating the steps of a method of etching a platinum layer in a semiconductor device according to the present invention.

Referring to FIG. 1, an interlevel dielectric layer 3 having a contact hole is formed on a semiconductor substrate 1 on which a transistor (not shown) is formed, using an insulating material. The contact hole is formed to expose a predetermined portion of the semiconductor substrate 1, e.g., a source of the transistor. Subsequently, a polysilicon layer and a metal layer, e.g., a titanium layer, are deposited on the entire surface of the semiconductor substrate 1 where the contact hole is formed, and the resultant structure is then annealed and etched back, to thereby form plug 5 and 7 filling the contact hole. In the preferred embodiment, the plugs 5 and 7 are comprised of a polysilicon 5 and a metal silicide 7.

Next, a barrier layer 9 is formed on the dielectric layer 3. The barrier layer 9 prevents silicon, which is among the materials of which the plugs are formed, from reacting with a platinum layer 11 to be formed subsequently. The barrier layer 9 may be formed of TiN, TiSiN or TaSiN, for example, and may be 300~500 Å in thickness.

Next, a platinum layer 11 which serves as a storage electrode layer of a capacitor, is formed on the barrier layer 9. A mask layer 13 formed of a material containing Ti or Ti compound is formed on the platinum layer 11. A TiN layer is used as the mask layer 13 in this embodiment. The TiN layer is an anti-reflection layer which suppresses the reflection of light from the platinum layer 11 during the photolithography of the platinum layer. Thus, the mask layer 13, which is a single TiN layer in this embodiment, may be a double layer composed of a Ti (or a TiO$_2$) layer and a TiN (or a SiON) layer. In other words, the mask layer 13 may be a double layer composed of a Ti layer and a TiN layer, a Ti layer and a SiON layer, a TiO$_2$ layer and a TiN layer or a TiO$_2$ layer and a SiON layer.

Next, a photoresist layer is coated on the mask layer 13 and patterned to form a photoresist pattern 15. The photoresist pattern 15 is formed for patterning the mask layer 13 and the platinum layer 11.

Figure 2:
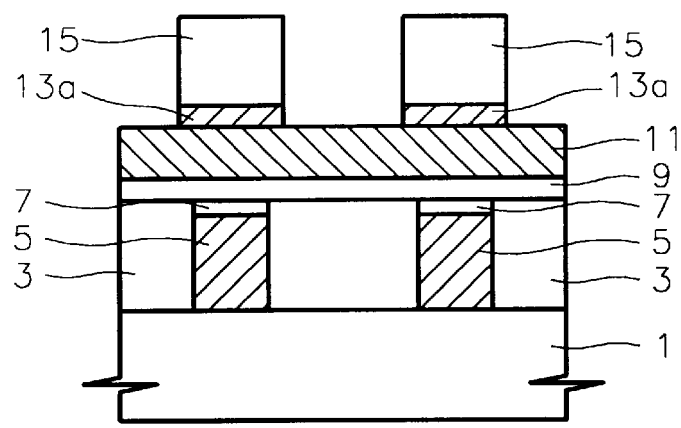

Referring to FIG. 2, the mask layer 13 is plasma-etched using the photoresist pattern 15 as a mask, to form a mask pattern 13a. The mask layer 13 may be plasma-etched using Ar/Cl$_2$, Cl$_2$/BCl$_3$ or Cl$_2$/HBr gas, for example.

Figure 3:
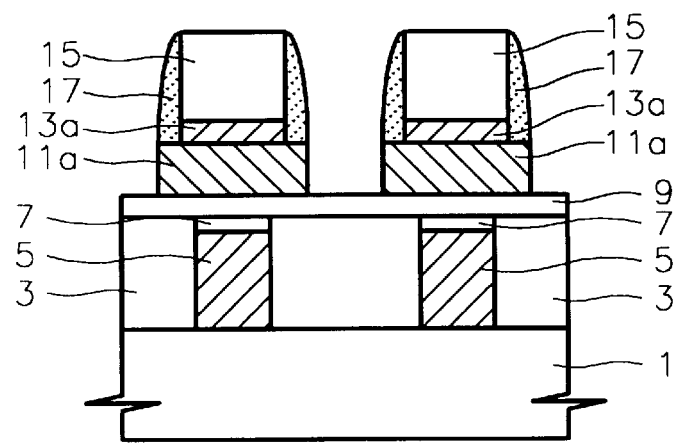

Referring to FIG. 3, the platinum layer 11 is plasma-etched using the photoresist pattern 15 and the mask pattern 13a as a mask to form a platinum pattern 11a. A platinum etching by-product 17 is formed on the sidewalls of the photoresist pattern 15 and the mask pattern 13a. The platinum layer 11 may be plasma-etched using Ar, Ar/Cl$_2$ or Ar/HBr gas, under a pressure of 10 mTorr or lower and ion energy of 500 eV or higher, for example. Preferably, the platinum layer 11 is plasma-etched using Ar/Cl$_2$ or Ar/HBr gas consisting of 80~95% Ar gas, such that the etch selectivity between the platinum layer 11 and the photoresist pattern 15 is 0.5:1 or higher.

When the platinum layer 11 is etched under the above-described conditions, etched platinum atoms are redeposited on the sidewalls of the photoresist pattern 15 to form the platinum etching by-product 17, which suppresses damage of the platinum pattern 11a that may result from the erosion of the photoresist pattern 15. Further, by etching the platinum layer with Ar, Ar/Cl$_2$ or Ar/HBr gas, an etch rate is increased which ensures a platinum pattern 1 la having a steep etch slope.

Figure 4:
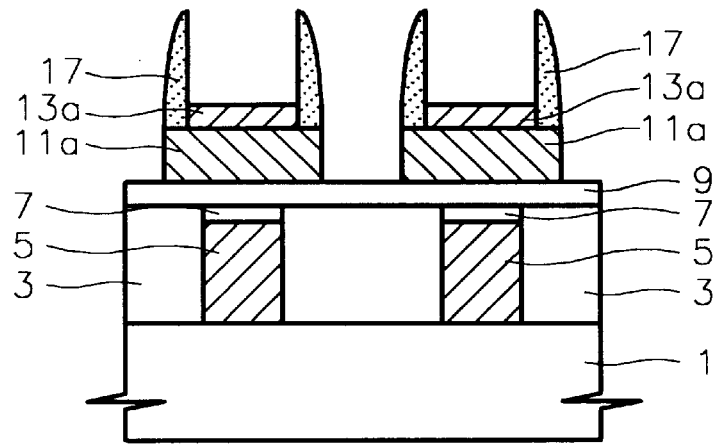

Referring to FIG. 4, the photoresist pattern 15 is removed by an O$_2$ plasma etching.

Figure 5:
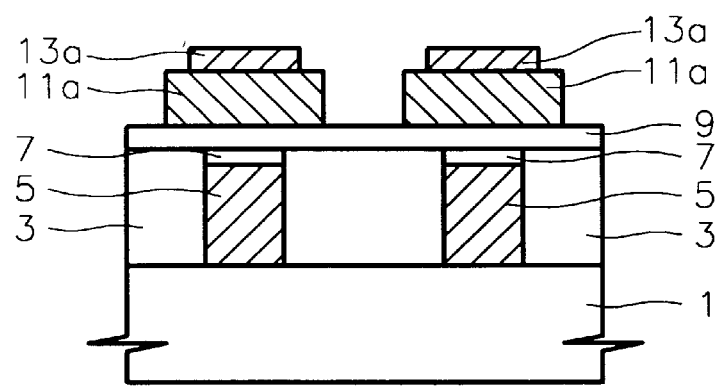

Referring to FIG. 5, the platinum etching by-product 17 formed on the sidewalls of the mask pattern 13a is removed by plasma-etching. The platinum etching byproduct 17 may be plasma-etched using Cl$_2$/O$_2$ or HBr/O$_2$ gas consisting of 40–95% O$_2$ gas, for example, such that the etch selectivity between the platinum pattern 11a and the mask pattern 13a is 5:1 or higher. Thus, while the platinum etching by-product 17 is completely removed, the mask pattern 13a is not etched without thereby giving damage to the platinum pattern 11 a. Here, the platinum pattern 11 a having a steep etch slope is formed.

Figure 6:
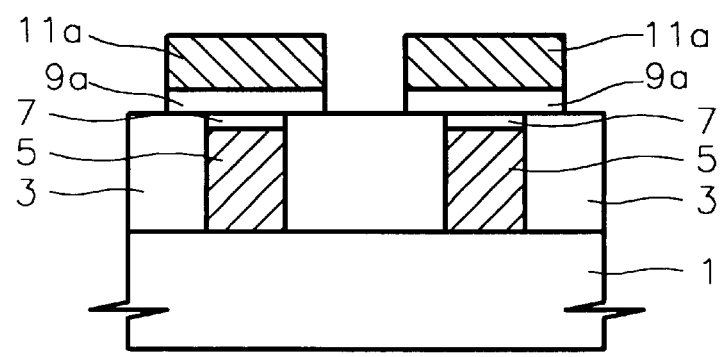

Referring to FIG. 6, the mask pattern 13a and the barrier layer 9 are simultaneously plasma-etched using Cl$_2$ gas, removing the mask pattern 13a and forming a barrier layer pattern 9a. Thus, the barrier layer pattern 9a and the platinum pattern 11a remain on the semiconductor substrate 1. The steps illustrated in FIGS. 2 through 6 may be performed in the same etch chamber. Finally, a dielectric layer (not shown) such as BST, PZT or PLZT and an upper electrode layer (not shown) are formed, to thereby complete a capacitor structure.

It is to be understood that the invention is not limited to the illustrated embodiment and that changes and modifications may be made within the scope of the invention as understood by a person skilled in the art.

What is claimed is:

1. A method for etching a platinum layer of a semiconductor device, comprising the steps of:

(a) forming a platinum layer;

(b) forming a Ti containing mask layer on the platinum layer;

(c) forming a photoresist pattern on the mask layer;

(d) etching the mask layer using the photoresist pattern as a mask to form a mask pattern, wherein the mask layer is plasma-etched using Ar/Cl$_2$, Cl$_2$/BCl$_3$ or Cl$_2$/HBr gas;

(e) etching the platinum layer using the photoresist pattern and the mask pattern as a mask to form a platinum pattern, wherein the platinum layer is plasma-etched using Ar, Ar/Cl$_2$ or Ar/HBr gas;

(f) removing the photoresist pattern;

(g) removing a platinum etching by-product formed on the sidewalls of the photoresist pattern and the mask pattern during formation of the platinum pattern by plasma-etching using Cl$_2$/O$_2$ or HBr/O$_2$ gas, wherein both Cl$_2$/O$_2$ and HBr/O$_2$ gas consist of 40–95% O$_2$ gas in volume; and (h) removing the mask pattern.

2. A method as recited in claim 1, wherein the mask layer includes a single TiN layer or a double layer structure consisting of a Ti layer and a TiN layer, a Ti layer and a SiON layer, a TiO$_2$ layer and a TiN layer, or a TiO$_2$ layer and a SiON layer.

3. A method as recited in claim 1, wherein both Ar/Cl$_2$ and Ar/HBr gas consist of 80–95% Ar gas in volume.

4. The method as recited in claim 1, wherein steps (a)–(h) are carried out in the same etch chamber.

5. A method for etching a platinum, layer of a semiconductor device, comprising the steps of:

(a) forming an interlevel dielectric layer having a contact hole on a semiconductor substrate;

(b) forming a plug in the contact hole;

(c) forming a barrier layer on the semiconductor substrate where the plug is formed, wherein the barrier layer is formed of TiN, TiSiN or TaSiN;

(d) forming a platinum layer on the barrier layer;

(e) forming a Ti containing mask layer on the platinum layer;

(f) forming a photoresist pattern on the mask layer;

(g) etching the mask layer using the photoresist pattern as a mask to form a mask pattern wherein the mask layer is plasma-etched using Ar/Cl$_2$, Cl$_2$/BCl$_3$ or Cl$_2$/HBr gas;

(h) etching the platinum layer using the photoresist pattern and the mask pattern as a mask to form a platinum pattern, wherein the platinum layer is plasma-etched using Ar, Ar/Cl$_2$ or Ar/HBr gas;

(i) removing the photoresist pattern;

(j) removing a platinum etching by-product formed on the sidewalls of the photoresist pattern and the mask pattern during formation of the platinum pattern by plasma-etching using Cl$_2$/O$_2$ or HBr/O$_2$ gas, wherein both Cl$_2$/O$_2$ and HBr/O$_2$ gas consist of 40–95% O$_2$ gas in volume; and (k) etching the mask pattern and the barrier layer to remove the mask pattern and to form a barrier pattern.

6. A method as recited in claim 5, wherein the mask layer is a single TiN layer or a double layer structure consisting of a Ti layer and a TiN layer, a Ti layer and a SiON layer, a TiO$_2$ layer and a TiN layer, or a TiO$_2$ layer and a SiON layer.

7. A method as claimed in claim 5, wherein both Ar/Cl$_2$ and Ar/HBr gas consist of 80–95% Ar gas in volume.

* * * * *